United States Patent
He et al.

(10) Patent No.: US 12,238,891 B2
(45) Date of Patent: Feb. 25, 2025

(54) METHOD AND APPARATUS FOR A MAGNETICALLY SUSPENDED FAN

(71) Applicant: Dell Products, LP, Round Rock, TX (US)

(72) Inventors: Qinghong He, Austin, TX (US); Travis C. North, Cedar Park, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 373 days.

(21) Appl. No.: 17/973,951

(22) Filed: Oct. 26, 2022

(65) Prior Publication Data

US 2024/0147656 A1  May 2, 2024

(51) Int. Cl.
  *H05K 7/20* (2006.01)
  *G06F 1/20* (2006.01)
  *H02K 7/14* (2006.01)

(52) U.S. Cl.
  CPC ......... *H05K 7/20172* (2013.01); *G06F 1/203* (2013.01); *H02K 7/14* (2013.01)

(58) Field of Classification Search
  None
  See application file for complete search history.

(56) References Cited

U.S. PATENT DOCUMENTS

| | | | |
|---|---|---|---|
| 5,818,131 A | 10/1998 | Zhang | |
| 7,938,627 B2 | 5/2011 | Muller | |
| 8,228,675 B2 | 7/2012 | Koplow | |
| 8,449,258 B2 | 5/2013 | Muller | |
| 8,506,254 B2 | 8/2013 | Muller | |
| 8,988,881 B2 | 3/2015 | Koplow | |
| 11,269,388 B2 * | 3/2022 | Kitamura | F04D 29/706 |
| 11,773,865 B2 * | 10/2023 | He | F04D 29/329 |
| | | | 361/679.48 |
| 2003/0068240 A1 * | 4/2003 | Hsieh | F04D 29/703 |
| | | | 417/368 |
| 2007/0121292 A1 * | 5/2007 | Ariga | G06F 1/203 |
| | | | 361/695 |
| 2009/0199997 A1 | 8/2009 | Koplow | |

(Continued)

FOREIGN PATENT DOCUMENTS

| | | |
|---|---|---|
| EP | 2302172 A1 | 3/2011 |
| WO | 1996/031937 A1 | 10/1996 |

(Continued)

*Primary Examiner* — Xanthia C Relford
(74) *Attorney, Agent, or Firm* — Prol Intellectual Property Law, PLLC; H. Kenneth Prol

(57) ABSTRACT

An information handling system includes a processor, a memory device, and a PMU to provide power to the processor and memory device. The information handling system further includes a magnetically suspended fan comprising a fan including a plurality of fan blades, a first set of permanent magnets operatively coupled to the plurality of fan blades, a second set of permanent magnets operatively coupled to an interior side of a top chassis cover of the information handling system, a third set of permanent magnets operatively coupled to an interior side of a bottom chassis cover of the information handling system. The second set of permanent magnets and third set of permanent magnets repel the first set of permanent magnets to suspend the plurality of fan blades between the top chassis cover and bottom chassis cover.

20 Claims, 7 Drawing Sheets

(56) References Cited

U.S. PATENT DOCUMENTS

| | | |
|---|---|---|
| 2011/0103011 A1 | 5/2011 | Koplow |
| 2011/0243770 A1 | 10/2011 | Muller |
| 2017/0300094 A1* | 10/2017 | Delano .................. F04D 25/08 |
| 2019/0242403 A1* | 8/2019 | Ma ........................ F04D 29/668 |
| 2020/0309138 A1* | 10/2020 | Tsai ...................... F04D 27/002 |
| 2021/0216120 A1* | 7/2021 | Kitamura ................ G06F 1/203 |
| 2022/0150335 A1* | 5/2022 | Sathyamurthy ....... H04M 1/026 |
| 2024/0147657 A1* | 5/2024 | North ................. H05K 7/20172 |

FOREIGN PATENT DOCUMENTS

| | | |
|---|---|---|
| WO | 2017/150940 A1 | 9/2017 |
| WO | 2018/221766 A1 | 12/2018 |

* cited by examiner

METHOD AND APPARATUS FOR A MAGNETICALLY SUSPENDED FAN

FIELD OF THE DISCLOSURE

The present disclosure generally relates to cooling systems for information handling system. The present disclosure more specifically relates to a magnetically suspended fan used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
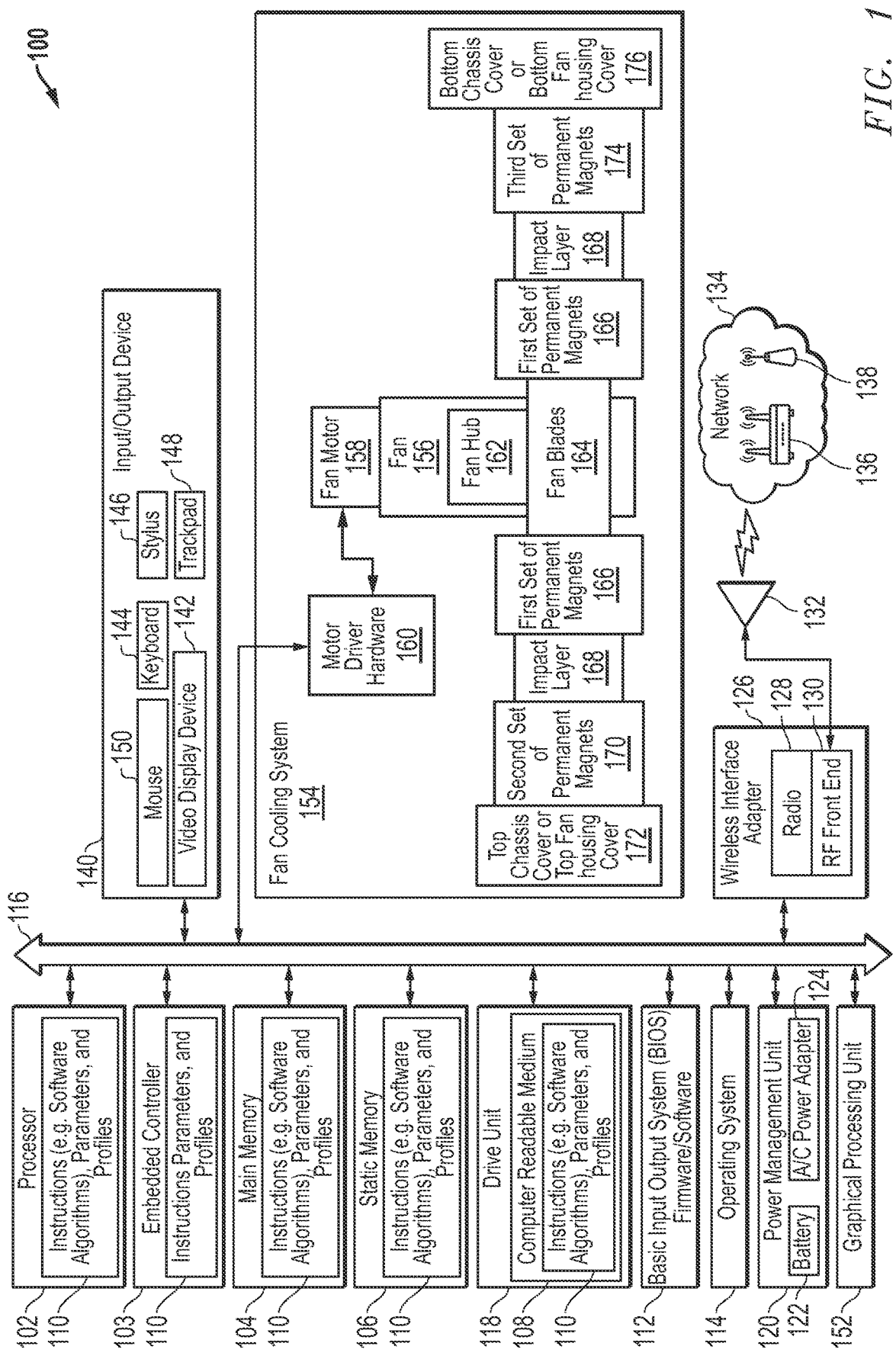
FIG. 1 is a block diagram of an information handling system housing a fan cooling system comprising a magnetically suspended fan according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan used to blow heat from within the housing to a vent to vent the heated air from within the housing. However, these fans may create a higher degree of noise that may interfere with the user of the information handling system especially when the fan speed is increased due to increased power consumption and a resulting increase in temperature within the housing.

The present specification describes an information handling system that includes a process, a memory device, and a power management unit (PMU) to provide power to the processor and memory device. The information handling system further includes a magnetically suspended fan comprising a fan including a plurality of fan blades, a first set of permanent magnets operatively coupled to the plurality of fan blades, a second set of permanent magnets operatively coupled to an interior side of a top fan housing cover or a top chassis of the base chassis of an information handling system, and a third set of permanent magnets operatively coupled to an interior side of a bottom cover fan housing or a bottom chassis of the information handling system. In some embodiments, the cooling fan of embodiments herein may have a fan housing with second set and third set of permanent magnets disposed therein. In other embodiments, the cooling fan of embodiments herein may be sandwiched between the top chassis cover and bottom chassis cover of the base chassis for the information handling system. In yet other embodiments, a partial fan housing may cover the top or bottom of the cooling fan. The second set of permanent magnets and third set of permanent magnets repel the first set of permanent magnets to suspend the plurality of fan blades between the keyboard chassis and bottom chassis, in an embodiment.

In an embodiment, an impact layer formed on an exterior surface of the first set of permanent magnets to prevent damage to the magnetically suspended fan during operation. Additionally, or alternatively, the impact layer is formed on an exterior surface of the second set of permanent magnets and third set of permanent magnets to prevent damage to the magnetically suspended fan during operation. As described herein, because the fan is magnetically suspended, any bumping or jarring of the information handling system may cause edges of fan blades of the fan to contact the second set of permanent magnets and third set of permanent magnets. In order to prevent damage to these components and the fan blades while the fan is rotating, the impact layer maybe added to absorb this kinetic energy.

In an embodiment, motor driver hardware may drive the rotation of the fan. The motor driver hardware may include a fan motor such as an electromagnetic driver within. The electromagnetic driver may magnetically interact with permanent magnets formed in a center hub of the fan so that the fan may be rotated. Other hardware and circuitry may be included to increase or decrease the speed of rotation of the fan when higher and lower temperatures are detected in the information handling system, respectively.

FIG. 1 illustrates an information handling system 100 similar to information handling systems according to several aspects of the present disclosure that is operatively couplable to a fan cooling system formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute with one or more hardware processing resources a set, or multiple sets, of instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, an embedded controller (EC) 103, hardware controllers, or any combination thereof. Additional components of the information handling system 100 can include one or more storage devices, one or more communications ports for communicating with external devices, as well as various input and output (I/O) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include hardware devices or hardware modules that embody one or more of the hardware processors to execute instructions for the one or more systems described above, and operates to perform one or more of the methods described herein. The information handling system 100 may execute machine-readable code instructions 110 via hardware processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

The information handling system 100 may include hardware processing resources such as a hardware processor 102, a central processing unit (CPU), accelerated processing unit (APU), an EC 103, a neural processing unit (NPU), a vision processing unit (VPU), an embedded controller (EC), a digital signal processor (DSP), a GPU 152, a microcontroller, or any other type of hardware processing device that executes code instructions to perform the processes described herein. Any of the hardware processing resources may operate to execute code that is either firmware or software code. Moreover, the information handling system 100 can include memory such as main memory 104, static memory 106, computer readable medium 108 storing instructions 110 of, in an example embodiment, a fan cooling system (e.g., controlled by a power management unit (PMU) controller), or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the hardware processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz. Other Bluetooth® operating frequencies such as Bluetooth® operating frequencies such as 6 GHz are also contemplated in the presented description. In an embodiment, a Bluetooth® wireless link may be used to wirelessly couple the input/output devices operatively and wirelessly including the mouse 150, keyboard 144, stylus 146, trackpad 148, and/or video display device 142 to the bus 116 in order for these devices to operate wirelessly with the information handling system 100.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to a fan cooling system 154. The fan cooling system 154 may be operatively coupled to a hardware processor 102, an EC 103 or other hardware processing devices to control the activation and operation of the fan 156 descried herein. These hardware processing resources may be provided with temperature data from one or more temperature sensors such as a thermistor. The temperature detected by the thermistor may indicate when and how fast to rotate the fan as described herein.

The fan cooling system 154 includes motor driver hardware 160 and a fan motor 158 used to rotate the fan 156. The motor driver hardware 160 and fan motor 158 may be operated via the hardware processor 103, an EC 103, or other hardware processing resource as a temperature of heat-generating hardware components are detected. In an embodiment, the fan motor 158 and motor driver hardware 160 may be activated and controlled as the temperature sensors detect changes in temperatures within the chassis of the information handling system and/or changes in temperatures of one or more hardware components within the chassis of the information handling system 100. In an embodiment, the motor driver hardware 160 and fan motor 158 may rotate the fan 156 at different speeds with the speed of the fan being increased linearly with the detected changes in temperature.

The fan 156 may include a fan hub 162 and a plurality of fan blades 164 radiating out from the fan hub 162. The fan blades 164 may be straight or curved and may be shaped to form an impeller or a propeller to either pull or push the air into and out of the chassis of the information handling system. In an embodiment, the fan motor 158 may include an electromagnetic motor that interfaces with one or more permanent magnets formed into the fan hub 162. As the electromagnetic motor is activated by the motor driver hardware 160, the selective repulsion or attraction by the electromagnets of the electromagnetic motor causes the fan hub 162 and fan blades 164 to rotate thereby creating an airflow through the housing of the information handling system.

The fan 156 described herein is a magnetically suspended fan suspended between an interior surface of a top chassis cover or top fan housing cover 172 and an interior surface of a bottom chassis cover or bottom fan housing cover 176 of the information handling system. In some embodiments, the fan cooling system 154 of embodiments herein may have a fan housing with the fan 156, first set of permanent magnets 166, second set of permanent magnets 170 and third set of permanent magnets 174 disposed therein between a top fan housing cover and a bottom fan housing cover. In other embodiments, the fan cooling system 154 of embodiments herein may be sandwiched between the top chassis cover and bottom chassis cover of the base chassis for the information handling system 100. In yet other embodiments, a partial fan housing may cover the top or bottom of the fan cooling system 154. As described herein, the information handling system 100 may be a 360°-type or laptop-type information handling system 100 that includes a plurality of metal chassis. The information handling system 100, in an embodiment, may comprise an outer metal case or shell of an information handling system 100 for housing internal components of the information handling system 100, such as a video display device 142, a cursor control device, and an alpha numeric input device (e.g., keyboard 144). In an embodiment, the information handling system 100 may include a video display device cover functioning to enclose a video display chassis with a back cover of the display chassis. As another example, the information handling system 100 may further include a top chassis cover functioning to enclose a cursor control device such as a trackpad 148 and a keyboard 144 acting as an alpha numeric input device. A bottom chassis cover may be operatively coupled to the top chassis cover to form a fully enclosed base chassis of the information handling system 100 where, in an embodiment, the fan cooling system 154, with or without a fan housing is placed to cool the hardware components placed therein.

In an embodiment, the fan 156 is magnetically suspended between the top chassis cover or top fan housing cover 172 and bottom chassis cover or bottom fan housing cover 176 via the use of sets of permanent magnets. The permanent magnets 170, 174 may be arranged such that their poles interact with the first set of permanent magnets 166 formed on the fan blades 164 of the fan 156 an repel the first set of permanent magnets 166. In an embodiment, the first set of permanent magnets 166 may be repelled away from the top chassis cover or top fan housing cover 172 by an oppositely-oriented second set of permanent magnets 170 affixed to an interior surface of the top chassis cover or top fan housing cover 172. Additionally, the first set of permanent magnets 166 may be repelled away from the bottom chassis cover or bottom fan housing cover 176 by an oppositely-oriented third set of permanent magnets 174 affixed to an interior surface of the bottom chassis cover or bottom fan housing cover 176. The first set of permanent magnets 166, second set of permanent magnets 170, and third set of permanent magnets 174 may be of the same magnetic polarity for repulsion magnetic force between them. This orientation of the first set of permanent magnets 166 relative to the second set of permanent magnets 170 and third set of permanent magnets 174 causes the entire fan 156 with its fan blades 164 and fan hub 162 to be suspended between the top chassis cover or top fan housing cover 172 and the bottom chassis cover or bottom fan housing cover 176. Because the fan hub 162 is not connected to a motor shaft and, instead, the fan 156 is driven by an electromagnetic fan motor 158, the fan 156 may be rotated between the second set of permanent magnets 170 and third set of permanent magnets 174 without mechanical interaction. This lack of mechanical interaction used to rotate the fan 156, significantly reduces structural borne noise and reduces the laptop overall acoustic noise level during operation of the fan 156. This further leads to higher customer satisfaction.

In an embodiment, the second set of permanent magnets 170 and third set of permanent magnets 174 may be shaped to include a trough into which the first set of permanent magnets 166 may fit such as within the fan housing or the base chassis formed by one or both of the top chassis cover or bottom chassis cover. This trough formed in the second set of permanent magnets 170 and third set of permanent magnets 174 may partially surround the first set of permanent magnets 166 such that movement of the first set of permanent magnets 166 is restricted to only passing through the trough. As such, movement of the first set of permanent magnets 166 is restricted not only in a vertical direction but also from side to side preventing the fan 156 from moving laterally between the second set of permanent magnets 170 and third set of permanent magnets 174 and, accordingly, between the top chassis cover or top fan housing cover 172 and bottom chassis cover or bottom fan housing cover 176.

In an embodiment, the first set of permanent magnets 166 may include an impact layer 168. Although the fan 156 is generally prevented from moving laterally between the second set of permanent magnets 170 and the third set of permanent magnets 174 via the troughs formed in these respective permanent magnet sets, bumping, or jarring of the base chassis of the information handling system 100 (e.g., the top chassis cover or top fan housing cover 172 and bottom chassis cover or bottom fan housing cover 176) may cause the first set of permanent magnets 166 to be moved slightly within the trough and potentially come in contact with the second set of permanent magnets 170 and/or third set of permanent magnets 174. In order to prevent damage to the first set of permanent magnets 166, the second set of permanent magnets 170, and the third set of permanent magnets 174, the first set of permanent magnets 166 may include an impact layer 168 as an outer coating to the first set of permanent magnets 166. In an embodiment, this impact layer 168 may be a soft material and magnetically inert such as a rubber or silicone. If the base chassis of the information handling system 100 were to be dropped, hit, or jarred, movement of the fan 156 laterally may cause the first set of permanent magnets 166 to come in contact with the second set of permanent magnets 170 or third set of permanent magnets 174. Damage from this collision will be limited or prevented with the impact layer 168 present. In some cases, the rotational speed of the fan 156 may be slowed, but once the first set of permanent magnets 166 is again repelled from the second set of permanent magnets 170 and third set of permanent magnets 174, the electric motor of the fan motor 158 may bring the fan 156 back up to the required fan speed.

Additionally, or alternatively in an embodiment, the second set of permanent magnets 170 and third set of permanent magnets 174 may include the impact layer 168. Again, in order to prevent damage to the first set of permanent magnets 166, the second set of permanent magnets 170, and the third set of permanent magnets 174, the second set of permanent magnets 170 and third set of permanent magnets 174 may include this impact layer 168 as an outer coating. Again, if the base chassis of the information handling system 100 were to be dropped, hit, or jarred, movement of the fan 156 laterally may cause the first set of permanent magnets 166 to come in contact with the second set of permanent magnets 170 or third set of permanent magnets 174 but this collision will not cause damage with the impact layer 168 present. In some cases, the rotational speed of the fan 156 may be slowed, but once the first set of permanent magnets 166 is again repelled from the second set of permanent magnets 170 and third set of permanent magnets 174, the electric motor of the fan motor 158 may bring the fan 156 back up to the required fan speed.

The orientation of the first set of permanent magnets 166 on the fan blades 164 may be such that the weight distribution on the fan 156 is maintained so that the rotation of the fan 156 between the second set of permanent magnets 170 and third set of permanent magnets 174 is accomplished. In an embodiment, the any given pair of first set of permanent magnets 166 may be attached to oppositely oriented fan blades 164 such that the weight of the first set of permanent magnets 166 may be equally distributed and so that the fan 156 is generally weighted correctly for rotation. It is appreciated that not all the fan blades 164, in an embodiment, may include a first set of permanent magnets 166 coupled to their terminal ends but a sufficient number of fan blades 164 may include a magnet in order to properly balance the fan 156 as it rotates between the second set of permanent magnets 170 and third set of permanent magnets 174.

The information handling system 100 can include one or more set of computer-readable code instructions 110 that can be executed by hardware processing resources to cause the computer system to perform any one or more of the methods or computer-based functions disclosed herein. For example, computer-readable code instructions 110 may execute, with hardware processing resources various software applications, software agents, a basic input/output system (BIOS) 112 firmware and/or software, or other aspects or components. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of computer-readable code instructions 110 such as software can be embedded to be executed by the hardware processor 102 or other hardware processing devices such as a GPU 152 or EC 103 to perform the processes described herein. Similarly, main memory 104 and static memory 106 may also contain a computer-readable medium for storage of one or more sets of computer-readable code instructions, parameters, or profiles 110 described herein. The disk drive unit 118 or static memory 106 also contain space for data storage. Further, the computer-readable code instructions 110 may embody one or more of the methods as described herein. In a particular embodiment, the computer-readable code instructions, parameters, and profiles 110 may reside completely, or at least partially, within the main memory 104, the static memory 106, and/or within the disk drive 118 during execution by the processor 102, EC 103, or GPU 152 of information handling system 100. The main memory 104, GPU 152, EC 103, and the processor 102 also may include or access computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a hardware processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a controller and executable code instructions to manage the power provided to the components of the information handling system 100 such as the hardware processor 102, EC 103, and manage control of the fan cooling system 154 that includes the fan motor 158, motor driver hardware 160, and any electromagnets associated with the driving of the fan 156. The PMU 120 may control power to one or more components including the fan motor 158, motor driver hardware 160, one or more drive units 118, the hardware processor 102 (e.g., CPU), the EC 103, the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels and be electrically coupled, either wired or wirelessly, to the information handling system 100 to provide this power and coupled to bus 116 to provide or receive data or instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits (ASICs), programmable logic arrays and other hardware devices can be constructed to implement one or more of the methods described herein. One or more embodiments described herein may implement functions using two or more specific interconnected hardware modules or devices with related control and data signals that can be communicated between and through the modules, or as portions of an application-specific integrated circuit. Accordingly, the present embodiments encompass hardware processing resources executing software or firmware, and hardware implementations.

When referred to as a "hardware system," a "hardware device," a "hardware module," a "hardware controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The hardware system, hardware device, hardware controller, or hardware module can execute software, firmware embedded at a device, hardware processing resource such as an Intel® Core class processor, ARM® brand processors, Qualcomm® Snapdragon processors, or other hardware processors and chipsets, or other such device, operating a relevant environment of the information handling system. The hardware system, hardware device, hardware controller, or hardware module can also include a combination of the foregoing examples of hardware or hardware executing software. Note that an information handling system can include an integrated circuit or a board-level product having portions thereof that can also be any combination of hardware components and hardware executing software. Hardware devices, hardware modules, hardware resources, or hardware controllers that are in communication with one another need not be in continuous communication with each other, unless expressly specified otherwise. In addition, hardware devices, hardware modules, hardware resources, or hardware controllers that are in communication with one another can communicate directly or indirectly through one or more intermediaries.

Figure 2:
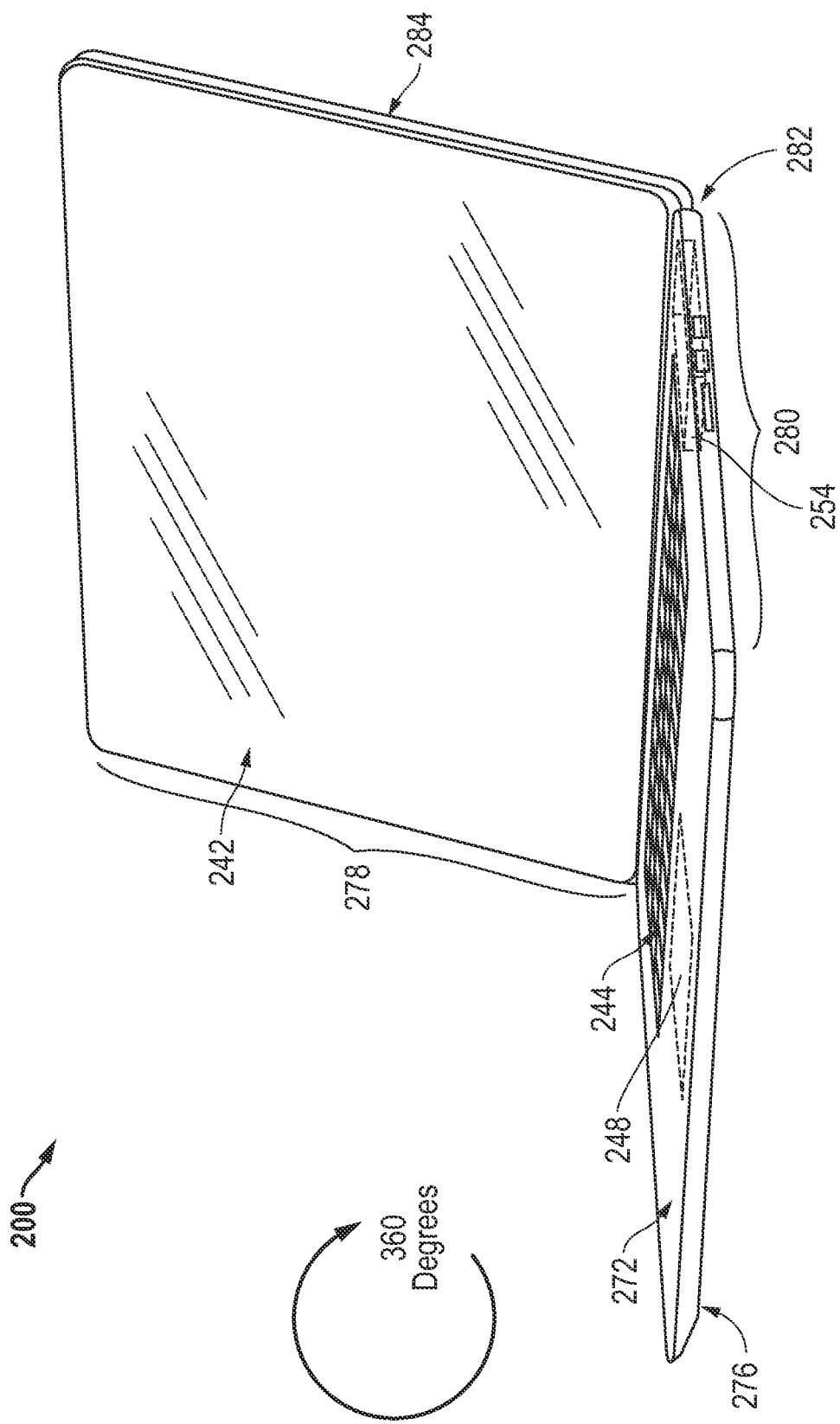
FIG. 2 is a graphic diagram of an information handling system housing a fan cooling system comprising a magnetically suspended fan according to an embodiment of the present disclosure.

FIG. 2 is a graphic diagram of an information handling system housing fan cooling system 254 according to an embodiment of the present disclosure. The information handling system 200 may, in an example embodiment, be a laptop-type information handling system 200. The information handling system 200 may, in an example embodiment, be a 360°-type information handling system 200. In the example shown in FIG. 2, the information handling system 200 may be a 360° information handling system 200 where an exterior surface of the bottom chassis cover 276 of a base chassis 280 may be brought towards an exterior side of the back display chassis 284 of the display chassis 278 to place the information handling system 200 in a tablet configuration in one embodiment. As shown in FIG. 2, the information handling system 200 may also be placed in a laptop configuration as shown in FIG. 2 where the base chassis 280 is lying flat on a surface with the display chassis 278 being placed upright from the base chassis 280. Other configurations such as a dual tablet configuration and a tent orientation are contemplated as described herein.

As described herein, the information handling system 200 may include a plurality of chassis made of metal, plastic, or the like. The information handling system 200, in an embodiment, may comprise an outer case or shell of an information handling system 200 for housing internal components of the information handling system 200, such as a video display device 242, a cursor control device, and an alpha numeric input device (e.g., keyboard 244). As shown in FIG. 2, the information handling system 200 may include a video display device 242 functioning to enclose the display chassis 278 with the back display chassis 284 described herein.

As another example, the information handling system 200 may further include the keyboard chassis cover 272 functioning to enclose a cursor control device such as a trackpad 248 and/or a keyboard 244 acting as an alpha numeric input device. The back display chassis 284 and the video display device 242 may be joined together in an embodiment to form a fully enclosed display chassis 278, while the top chassis cover 272 and a bottom chassis cover 276 may be joined together to form a fully enclosed base chassis 280. Taking a closed configuration as a reference position of the video display device 242 including the back display chassis 284 and the base chassis 280 including the keyboard chassis cover 272 and bottom chassis cover 276, the video display device 242 and back display chassis 284 may be rotated away from the base chassis 280 into the laptop configuration as shown in FIG. 2.

As described herein, an exhaust vent or inlet vent, depending on whether the fan is an impeller or propeller, may be formed on a rear sidewall surface where the keyboard chassis cover 272 and bottom chassis cover 276 are coupled together, on a side sidewall surface where the keyboard chassis cover 272 and bottom chassis cover 276 are coupled together. In some example embodiments described herein, an inlet vent or exhaust vent may be disposed on a bottom side of the bottom chassis cover 276 allowing an airflow to pass up into or out from underneath the information handling system 200. In some example embodiments described herein, an inlet vent or exhaust vent may be disposed on a top side of the keyboard chassis cover 272 allowing an airflow to pass up into or out from underneath the information handling system 200. Additionally, the base chassis 280 may be operatively coupled to a display chassis 278 via a hinge 282. In an embodiment, this hinge 282 may be a drop-down hinge that drops the display chassis 278 down as the display chassis 278 is placed in an open position as shown.

As described herein, the fan cooling system shown at a fan cooling system location 254 is located within the housing information handling system 200. The fan cooling system 254 may include a fan housing in one embodiment or may be formed between one or both of a top chassis cover 272 or a bottom chassis cover 276 of the base chassis 280. The fan cooling system location 254 may, in an example embodiment, be at any location in, for example the base chassis 280, of the information handling system 200. The fan cooling system location 254 can be configured in a variety of configurations that include an inlet/exhaust vent draws air in or that expels heat downward and out of the base chassis 280 of the information handling system 200.

Figure 3:
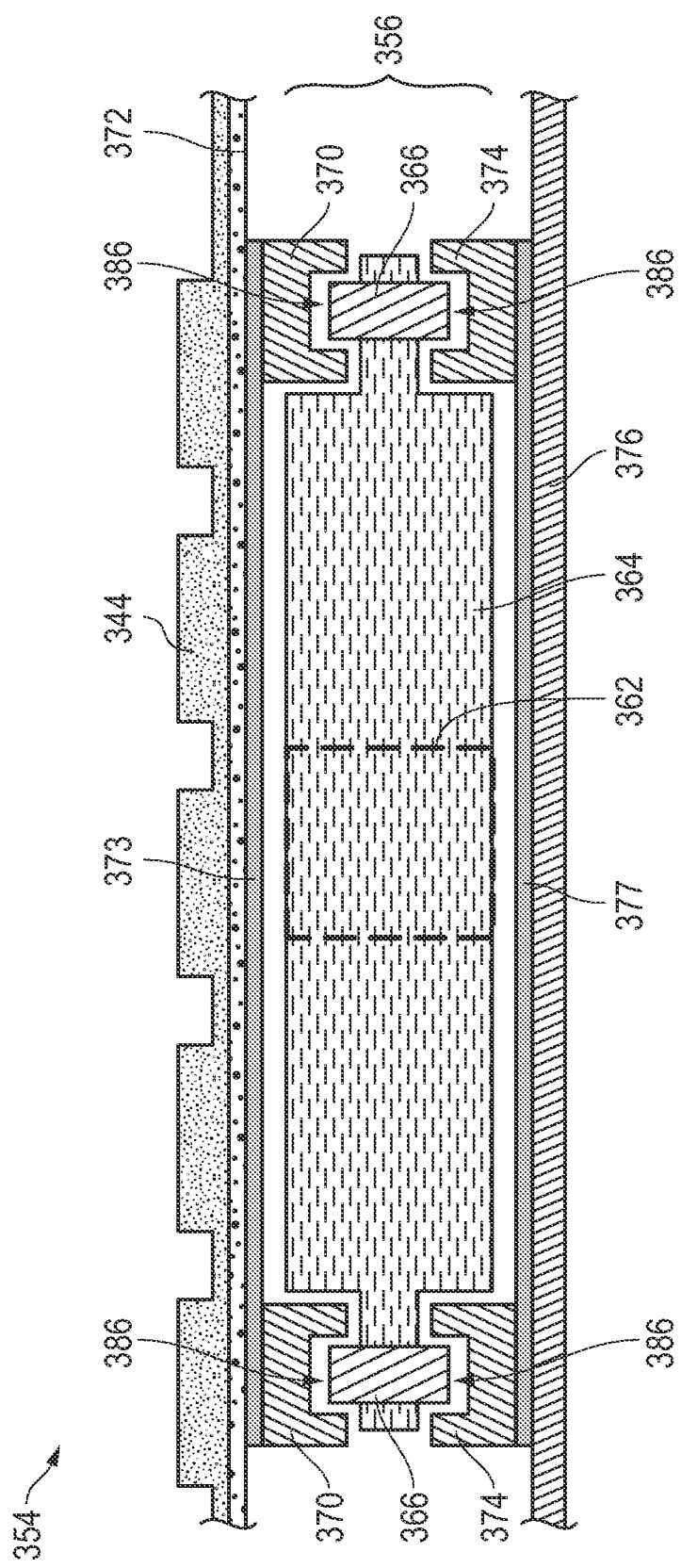
FIG. 3 is a graphic diagram cross-sectional view of an information handling system housing a fan cooling system comprising a magnetically suspended fan according to an embodiment of the present disclosure.

FIG. 3 is a graphic diagram partial cross-sectional view of an information handling system housing a fan cooling system 354 comprising a magnetically suspended fan 356 according to an embodiment of the present disclosure. As described herein, the information handling system may include and be operatively coupled to a fan cooling system 354 disposed between the top chassis cover 372 and the bottom chassis cover 376. In the embodiment shown in FIG. 3, the fan cooling system is disposed in a fan housing with a top fan housing cover 373 and a bottom fan housing cover 377. In other embodiments, the fan cooling system 354 may be sandwiched between either or both of the top chassis cover 372 or the bottom chassis cover 376. The fan cooling system 354 may be operatively coupled to a hardware processor, an EC, or other hardware processing devices to control the activation and operation of the fan 356 described herein. These hardware processing resources may be provided with temperature data from one or more temperature sensors such as a thermistor. The temperature detected by the thermistor may indicate when and how fast to rotate the fan as described herein.

The fan cooling system 354 includes motor driver hardware (not shown) and a fan motor (not shown) at central hub location 362 used to rotate the fan 356. The motor driver hardware and fan motor may be operated via the hardware processor, an EC, or other hardware processing resource as a temperature of heat-generating hardware components are detected. In an embodiment, the fan motor and motor driver hardware may be activated and controlled as the temperature sensors detect changes in temperatures within the chassis of the information handling system and/or changes in temperatures of one or more hardware components within the chassis of the information handling system. In an embodiment, the motor driver hardware and fan motor may rotate the fan 356 at different speeds with the speed of the fan being increased linearly with the detected changes in temperature.

The fan 356 may include a fan hub at fan hub location 362 and a plurality of fan blades 364 radiating out from the fan hub. The fan blades 364 may be straight or curved and may be shaped to form an impeller or a propeller to either pull or push the air into and out of the chassis of the information handling system. In an embodiment, the fan motor may be an inductive electromagnetic motor that interfaces with one or more central hub permanent magnets formed into the fan hub at 362. As the electromagnetic motor is activated by the motor driver hardware, the selective repulsion or attraction by the electromagnets of the electromagnetic motor causes the fan hub and fan blades 364 to rotate thereby creating an airflow through the housing of the information handling system.

The fan 356 described herein in FIG. 3 is a magnetically suspended fan suspended between an interior surface of a top fan housing cover 373 and an interior surface of a bottom fan housing cover 377 of the information handling system. In some embodiments, the fan 356 of embodiments herein may have a fan housing 373, 377 with second set and third set of permanent magnets disposed therein. In other embodiments, the cooling fan of embodiments herein may be sandwiched between the top chassis cover 372 and bottom chassis cover 376 of the base chassis for the information handling system as shown further in example embodiments of FIGS. 4A, 4B, and 4C. In yet other embodiments, a partial fan housing may cover the top or bottom of the fan 356.

As show in FIG. 3, a top chassis cover 372 includes a keyboard 344 used by a user to provide alphanumeric input to the information handling system and supports the top fan housing cover 373 in the shown embodiment. As described herein, the information handling system may be a 360°-type or laptop-type information handling system that includes a plurality of metal chassis. The information handling system, in an embodiment, may comprise an outer metal case or shell of an information handling system for housing internal components of the information handling system, such as a video display device, a cursor control device, and an alpha numeric input device (e.g., keyboard 344). In an embodiment, the information handling system may include a video display device cover functioning to enclose a video display chassis with a back cover of the display chassis. As another example, the information handling system may further include a top chassis cover 372 functioning to enclose a cursor control device such as a trackpad (not shown) and the keyboard 344 acting as an alpha numeric input device. A bottom chassis cover 376 may be operatively coupled to the top chassis cover 372 to form a fully enclosed base chassis of the information handling system where, in an embodiment, the fan cooling system 354 is placed to cool the hardware components placed therein.

In an embodiment, the fan 356 is magnetically suspended between the top fan housing cover 373 and bottom fan housing cover 377 via the use of sets of permanent magnets. The permanent magnets may be arranged such that their poles interact with the first set of permanent magnets 366 formed on the fan blades 364 of the fan 356 an repel the first set of permanent magnets 366. In an embodiment, the first set of permanent magnets 366 may be repelled away from the top fan housing cover 373 by an oppositely-oriented second set of permanent magnets 370 affixed to an interior surface of the top fan housing cover 373. Additionally, the first set of permanent magnets 366 may be repelled away from the bottom fan housing cover 377 by an oppositely-oriented third set of permanent magnets 374 affixed to an interior surface of the bottom fan housing cover 377. This orientation of the first set of permanent magnets 366 relative to the second set of permanent magnets 370 and third set of permanent magnets 374 causes the entire fan 356 with its fan blades 364 and fan hub 362 to be suspended between the top fan housing cover 373 and the bottom fan housing cover 377. Because the fan hub 362 is not connected to a motor shaft and, instead, the fan 356 is driven by an electromagnetic fan motor (not shown), the fan 356 may be rotated between the second set of permanent magnets 370 and third set of permanent magnets 374 without mechanical interaction. This lack of mechanical interaction used to rotate the fan 356, significantly reduces structural borne noise and reduces the laptop overall acoustic noise level during operation of the fan 356. This further leads to higher customer satisfaction. It is contemplated that in other embodiments, such as shown in FIGS. 4A, 4B, and 4C, the second and third sets of permanent magnets 370, 374 may be disposed on an inner surface or either or both of the top chassis cover 372 or bottom chassis cover 376.

In an embodiment, the second set of permanent magnets 370 and third set of permanent magnets 374 may be shaped to include a trough 386 into which the first set of permanent magnets 366 may fit. This trough 386 formed in the second set of permanent magnets 370 and third set of permanent magnets 374 may partially surround the first set of permanent magnets 366 such that movement of the first set of permanent magnets 366 is restricted to only passing through the trough 386. As such, movement of the first set of permanent magnets 366 is restricted not only in a vertical direction but also from side to side preventing the fan 356 from moving laterally between the second set of permanent magnets 370 and third set of permanent magnets 374 and, accordingly, between the top fan housing cover 373 (or top chassis cover 372) and bottom fan housing cover 377 (or bottom chassis cover 372).

The orientation of the first set of permanent magnets 366 on the fan blades 364 may be such that the weight distribution on the fan 356 is maintained so that the rotation of the fan 356 between the second set of permanent magnets 370 and third set of permanent magnets 374 is accomplished. In an embodiment, the any given pair of first set of permanent magnets 366 may be attached to oppositely oriented fan blades 364 such that the weight of the first set of permanent magnets 366 may be equally distributed and so that the fan 356 is generally weighted correctly for rotation. It is appreciated that not all the fan blades 364, in an embodiment, may include a first set of permanent magnets 366 coupled to their terminal ends but a sufficient number of fan blades 364 may include a magnet in order to properly balance the fan 356 as it rotates between the second set of permanent magnets 370 and third set of permanent magnets 374.

Figure 4A:
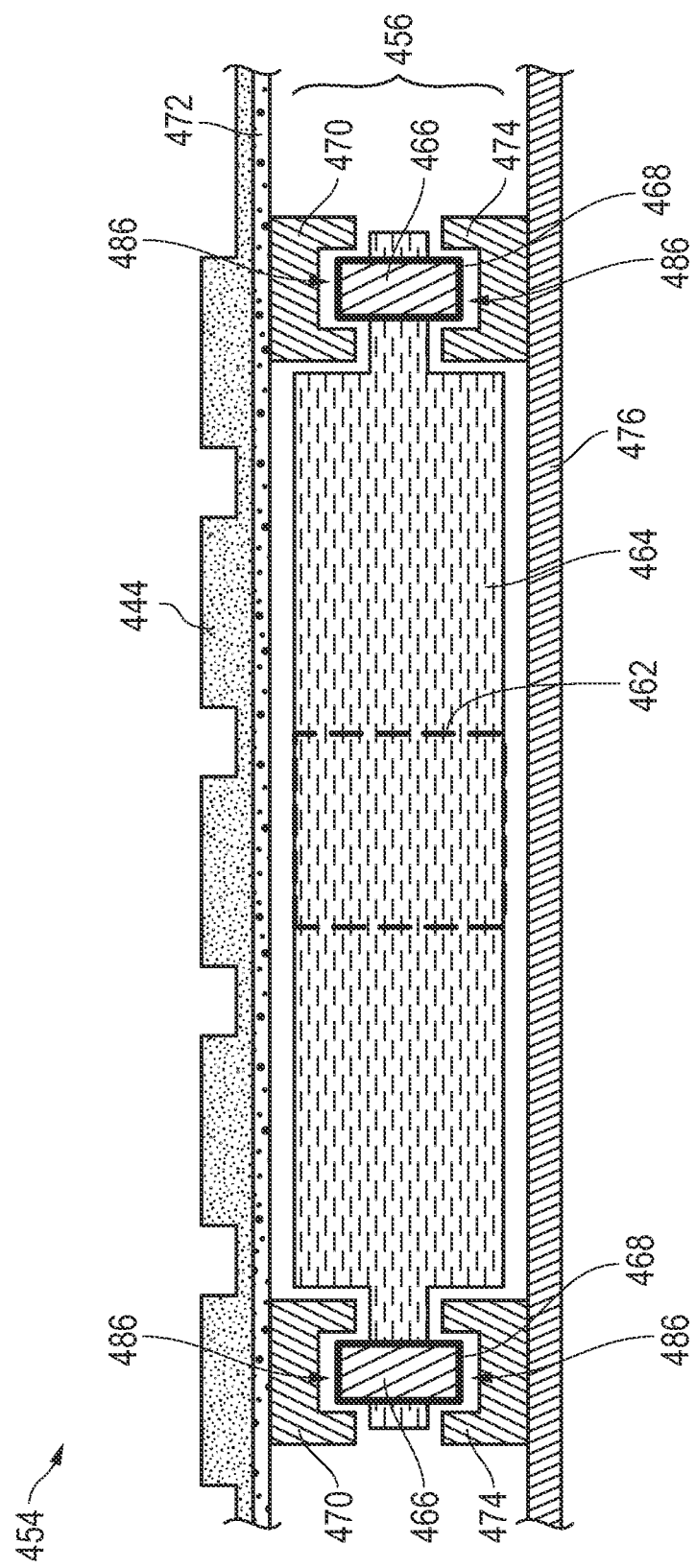
FIG. 4A is a graphic diagram cross-sectional view of an information handling system housing a fan cooling system comprising a magnetically suspended fan according to an embodiment of the present disclosure.
Figure 4B:
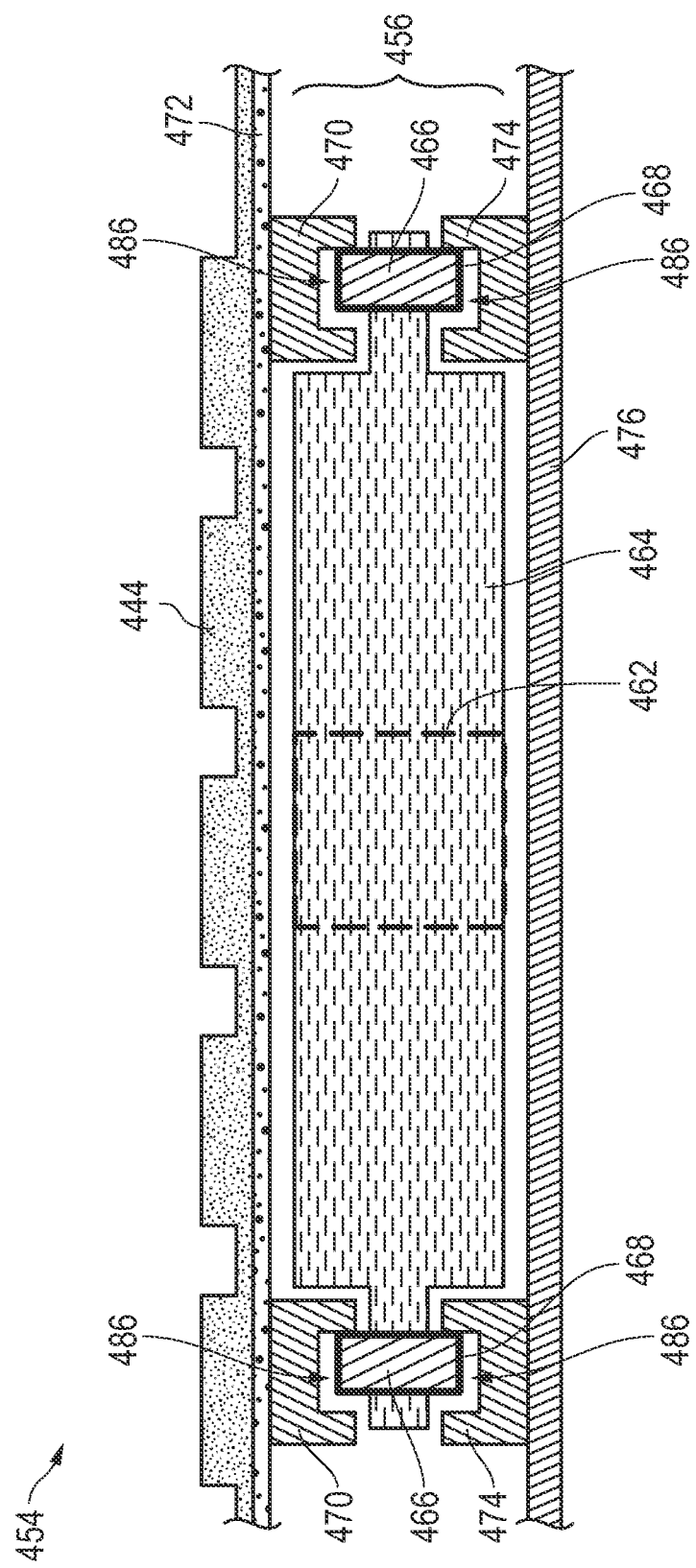
FIG. 4B is a graphic diagram cross-sectional view of an information handling system housing a fan cooling system comprising a magnetically suspended fan according to another embodiment of the present disclosure.
Figure 4C:
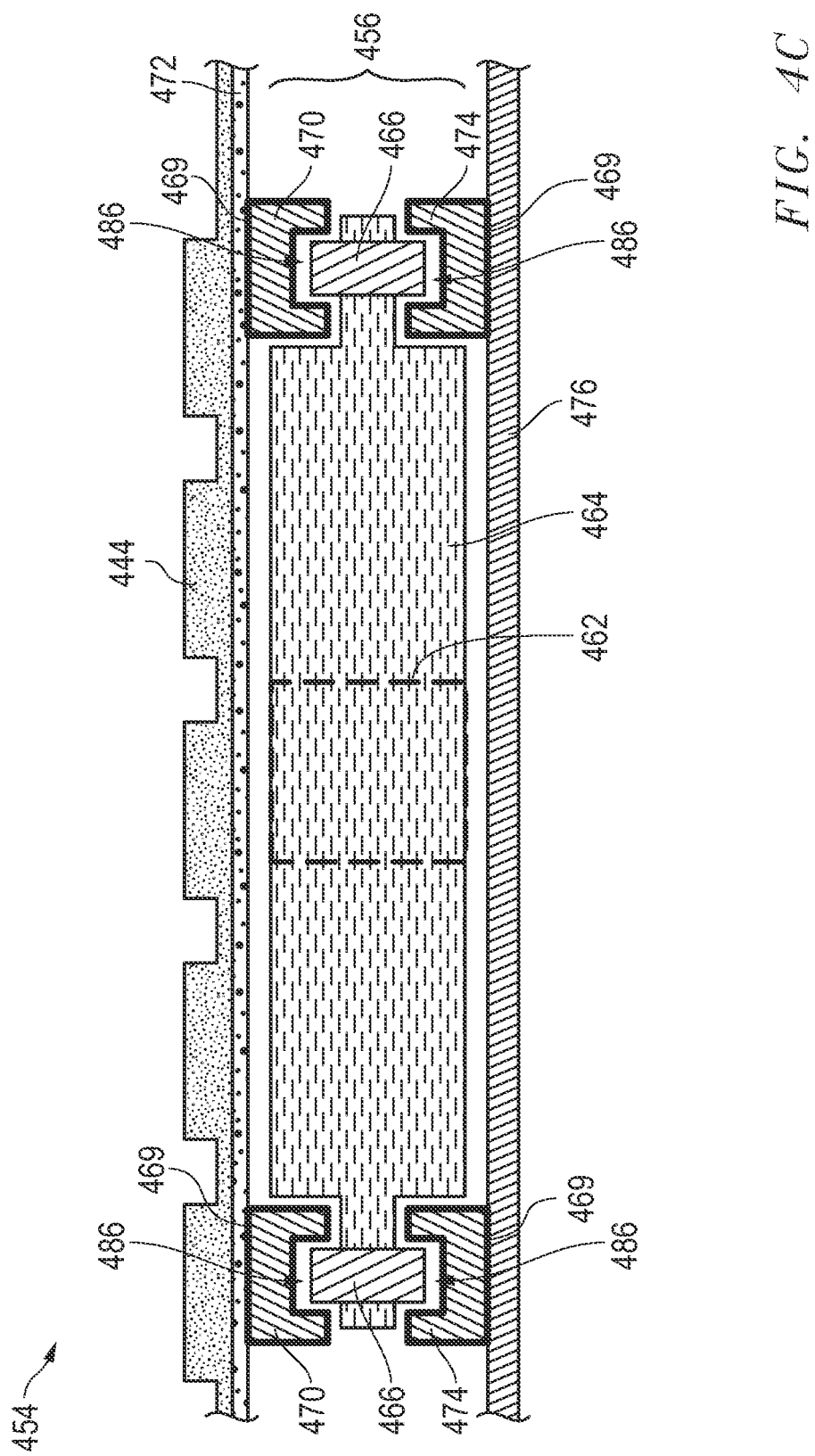
FIG. 4C is a graphic diagram cross-sectional view of an information handling system housing a fan cooling system comprising a magnetically suspended fan according to another embodiment of the present disclosure.

FIG. 4A is a graphic diagram partial cross-sectional view of an information handling system housing a fan cooling system 454 comprising a magnetically suspended fan according to another embodiment of the present disclosure. As described herein, the information handling system may include and be operatively coupled to a fan cooling system 454. The fan cooling system 454 may be operatively coupled to a hardware processor, an EC or other hardware processing devices to control the activation and operation of the fan 456 descried herein. These hardware processing resources may be provided with temperature data from one or more temperature sensors such as a thermistor. The temperature detected by the thermistor may indicate when and how fast to rotate the fan as described herein.

The fan 456 may include a fan hub at a fan hub location 462 and a plurality of fan blades 464 radiating out from the fan hub. The fan blades 464 may be straight or curved and may be shaped to form an impeller or a propeller to either pull or push the air into and out of the chassis of the information handling system. In an embodiment, the fan motor 458 may include an electromagnetic motor that interfaces with one or more central hub permanent magnets formed into the fan hub. As the electromagnetic motor is activated by the motor driver hardware 460, the selective repulsion or attraction or attraction by the electromagnets of the electromagnetic motor causes the fan hub and fan blades 464 to rotate thereby creating an airflow through the housing of the information handling system.

The fan 456 described herein is a magnetically suspended fan suspended between an interior surface of a top chassis cover or top fan housing cover 472 and an interior surface of a bottom chassis cover or bottom fan housing cover 476 of the information handling system. As described herein, the information handling system may be a 360°-type or laptop-type information handling system that includes a plurality of metal chassis portions. The information handling system, in an embodiment, may comprise an outer metal case or shell of an information handling system for housing internal components of the information handling system, such as a video display device 442, a cursor control device, and an alpha numeric input device (e.g., keyboard 444). In an embodiment, the information handling system may include a video display device cover functioning to enclose a video display chassis with a back cover of the display chassis. As another example, the information handling system may further include a top cover or top chassis cover or top fan housing cover 472 functioning to enclose a cursor control device such as a trackpad 448 and a keyboard 444 acting as an alpha numeric input device. A bottom chassis cover or bottom fan housing cover 476 may be operatively coupled to the top chassis cover or top fan housing cover 472 to form a fully enclosed base chassis of the information handling system where, in an embodiment, the fan cooling system 454 is placed to cool the hardware components placed therein.

In an embodiment, the fan 456 is magnetically suspended between the top chassis cover or top fan housing cover 472 and bottom chassis cover or bottom fan housing cover 476 via the use of sets of permanent magnets. The second and third sets of permanent magnets 470 and 474 may be arranged such that their poles interact with the first set of permanent magnets 466 formed on the fan blades 464 of the fan 456 an repel the first set of permanent magnets 466. In other words, the first set of permanent magnets 466, second set of permanent magnets 470, and third set of permanent magnets may have the same magnetic polarity yielding a repelling magnetic force. In an embodiment, the first set of permanent magnets 466 may be repelled away from the top chassis cover or top fan housing cover 472 by an oppositely-oriented second set of permanent magnets 470 affixed to an interior surface of the top chassis cover or top fan housing cover 472. Additionally, the first set of permanent magnets 466 may be repelled away from the bottom chassis cover or bottom fan housing cover 476 by an oppositely-oriented third set of permanent magnets 474 affixed to an interior surface of the bottom chassis cover or bottom fan housing cover 476. This orientation of the first set of permanent magnets 466 relative to the second set of permanent magnets 470 and third set of permanent magnets 474 causes the entire fan 456 with its fan blades 464 and fan hub 462 to be suspended between the top chassis cover or top fan housing cover 472 and the bottom chassis cover or bottom fan housing cover 476. Because the fan hub 462 is not connected to a motor shaft and, instead, the fan 456 is driven by an electromagnetic fan motor 458, the fan 456 may be rotated between the second set of permanent magnets 470 and third set of permanent magnets 474 without mechanical interaction. This lack of mechanical interaction used to rotate the fan 456, significantly reduces structural borne noise and reduces the laptop overall acoustic noise level during operation of the fan 456. This further leads to higher customer satisfaction.

In an embodiment, the second set of permanent magnets 470 and third set of permanent magnets 474 may be shaped to include a trough 486 into which the first set of permanent magnets 466 may fit. This trough 486 formed in the second set of permanent magnets 470 and third set of permanent magnets 474 may partially surround the first set of permanent magnets 466 such that movement of the first set of permanent magnets 466 is restricted to only passing through the trough 486. As such, movement of the first set of permanent magnets 466 is restricted not only in a vertical direction but also from side to side preventing the fan 456 from moving laterally between the second set of permanent magnets 470 and third set of permanent magnets 474 and, accordingly, between the top chassis cover or top fan housing cover 472 and bottom chassis cover or bottom fan housing cover 476.

In an embodiment, the first set of permanent magnets 466 may include an impact layer 468. Although the fan 456 is generally prevented from moving laterally between the second set of permanent magnets 470 and the third set of permanent magnets 474 via the troughs 486 formed in these respective permanent magnet sets, bumping or jarring of the base chassis of the information handling system (e.g., the top chassis cover or top fan housing cover 472 and bottom chassis cover or bottom fan housing cover 476) may cause the first set of permanent magnets 466 to be moved slightly within the trough 486 and potentially come in contact with the second set of permanent magnets 470 and/or third set of permanent magnets 474. In order to prevent damage to the first set of permanent magnets 466, the second set of permanent magnets 470, and the third set of permanent magnets 474, the first set of permanent magnets 466 may include an impact layer 468 as an outer coating to the first set of permanent magnets 466. In an embodiment, this impact layer 468 may be a soft material and magnetically inert such as a rubber or silicone. If the base chassis of the information handling system were to be dropped, hit, or jarred, then movement of the fan 456 laterally may cause the first set of permanent magnets 466 to come in contact with the second set of permanent magnets 470 or third set of permanent magnets 474. However, damage from this collision will be limited or prevented with the impact layer 468 present. In some cases, the rotational speed of the fan 456 may be slowed, but once the first set of permanent magnets 466 is again repelled from the second set of permanent magnets 470 and third set of permanent magnets 474, the electric motor of the fan motor 458 may bring the fan 456 back up to the required fan speed.

Additionally, or alternatively in an embodiment, the second set of permanent magnets 470 and third set of permanent magnets 474 may include the impact layer 468. Again, in order to prevent damage to the first set of permanent magnets 466, the second set of permanent magnets 470, and the third set of permanent magnets 474, the second set of permanent magnets 470 and third set of permanent magnets 474 may include this impact layer 468 as an outer coating. Again, if the base chassis of the information handling system were to be dropped, hit, or jarred, movement of the fan 456 laterally may cause the first set of permanent magnets 466 to come in contact with the second set of permanent magnets 470 or third set of permanent magnets 474. Damage from such a collision is limited or prevented with the impact layer 468 present. In some cases, the rotational speed of the fan 456 may be slowed, but once the first set of permanent magnets 466 is again repelled from the second set of permanent magnets 470 and third set of permanent magnets 474, the electric motor of the fan motor 458 may bring the fan 456 back up to the required fan speed.

The orientation of the first set of permanent magnets 466 on the fan blades 464 may be such that the weight distribution on the fan 456 is maintained so that the rotation of the fan 456 between the second set of permanent magnets 470 and third set of permanent magnets 474 is accomplished. In an embodiment, the any given pair of first set of permanent magnets 466 may be attached to oppositely oriented fan blades 464 such that the weight of the first set of permanent magnets 466 may be equally distributed and so that the fan 456 is generally weighted correctly for rotation. It is appreciated that not all the fan blades 464, in an embodiment, may include a first set of permanent magnets 466 coupled to their terminal ends but a sufficient number of fan blades 464 may include a magnet in order to properly balance the fan 456 as it rotates between the second set of permanent magnets 470 and third set of permanent magnets 474.

In an embodiment, the first set of permanent magnets 466 may include an impact layer 468. Although the fan 456 is generally prevented from moving laterally between the second set of permanent magnets 470 and the third set of permanent magnets 474 via the troughs 486 formed in these respective permanent magnet sets, bumping or jarring of the base chassis of the information handling system (e.g., the top chassis cover or top fan housing cover 472 and bottom chassis cover or bottom fan housing cover 476) may cause the first set of permanent magnets 466 to be moved slightly within the trough 486 and potentially come in contact with the second set of permanent magnets 470 and/or third set of permanent magnets 474. In order to prevent damage to the first set of permanent magnets 466, the second set of permanent magnets 470, and the third set of permanent magnets 474, the first set of permanent magnets 466 may include an impact layer 468 as an outer coating to the first set of permanent magnets 466. In an embodiment, this impact layer 468 may be a soft material and magnetically inert such as a rubber. If the base chassis of the information handling system were to be dropped, hit, or jarred, movement of the fan 456 laterally may cause the first set of permanent magnets 466 to come in contact with the second set of permanent magnets 470 or third set of permanent magnets 474 but this collision will not cause damage with the impact layer 468 present. In some cases, the rotational speed of the fan 456 may be slowed, but once the first set of permanent magnets 466 is again repelled from the second set of permanent magnets 470 and third set of permanent magnets 474, the electric motor of the fan motor 458 may bring the fan 456 back up to the required fan speed.

FIG. 4B is a graphic diagram partial cross-sectional view of an information handling system housing a fan cooling system 454 comprising a magnetically suspended fan according to another embodiment of the present disclosure. Similar to FIG. 4A, FIG. 4B shows the keyboard 444 operatively coupled to the keyboard chassis 472. The second set of permanent magnets 470 are operatively coupled to an interior surface of the top chassis cover or top fan housing cover 472 and the third set of permanent magnets are operatively coupled to an interior surface of the bottom chassis cover or bottom fan housing cover 476.

FIG. 4B shows an instance when the information handling system were to be dropped, hit, or jarred, causing movement of the fan 456 laterally (e.g., to the right in FIG. 4B) slightly such that the first set of permanent magnets 466 is made to come in contact with the second set of permanent magnets 470 or third set of permanent magnets 474. However, this collision will not cause damage with the impact layer 468 present. Because the impact layer 468 is present, damage to the second set of permanent magnets 470 coupled to the top chassis cover or top fan housing cover 472 and third set of permanent magnets 474 coupled to the bottom chassis cover or bottom fan housing cover 476 is minimized or prevented. Additionally, the fan blades 464 of the fan 456 may be reoriented when the information handling system is no longer being jarred or bumped allowing the rotation of the fan blades 464 about the fan hub at the fan hub location 462 to continue.

FIG. 4C is a graphic diagram cross-sectional view of an information handling system housing a fan cooling system 454 comprising a magnetically suspended fan according to another embodiment of the present disclosure. Similar to FIGS. 4A and 4B, FIG. 4C shows the keyboard 444 operatively coupled to the top chassis cover or top fan housing cover 472. The second set of permanent magnets 470 are operatively coupled to an interior surface of the top chassis cover or top fan housing cover 472 and the third set of permanent magnets are operatively coupled to an interior surface of the bottom chassis cover or bottom fan housing cover 476.

As described herein, in addition or in an alternative embodiment, the second set of permanent magnets 470 and third set of permanent magnets 474 may include the impact layer 468. Again, in order to prevent damage to the first set of permanent magnets 466, the second set of permanent magnets 470, and the third set of permanent magnets 474, the second set of permanent magnets 470 and third set of permanent magnets 474 may include this impact layer 468 as an outer coating. Again, if the base chassis of the information handling system were to be dropped, hit, or jarred, movement of the fan 456 laterally may cause the first set of permanent magnets 466 to come in contact with the second set of permanent magnets 470 or third set of permanent magnets 474. However, such a collision will not cause damage with the impact layer 468 present. In some cases, the rotational speed of the fan 456 and its fan blades 464 and fan hub 462 may be slowed, but once the first set of permanent magnets 466 is again repelled from the second set of permanent magnets 470 and third set of permanent magnets 474, the electric motor of the fan motor 458 may bring the fan 456 back up to the required fan speed.

It is contemplated that various features of the embodiments of FIGS. 3, 4A, 4B and 4C in any combination may be used for a fan cooling system shown as 354 or 454 according to embodiments herein. For example, a fan housing with either or both of a top fan housing cover 373 or a bottom fan housing cover 377 may be used to support the second and third sets of permanent magnets allowing for space above or below the fan cooling system for other components with embodiments of FIGS. 4A, 4B, and 4C. In another embodiment, no fan housing may be utilized according to embodiments herein. Further, it is contemplated that any combination of impact layers 468 or 469 may be used with any embodiment of the fan cooling system 354 or 454 in the embodiments herein.

Figure 5:
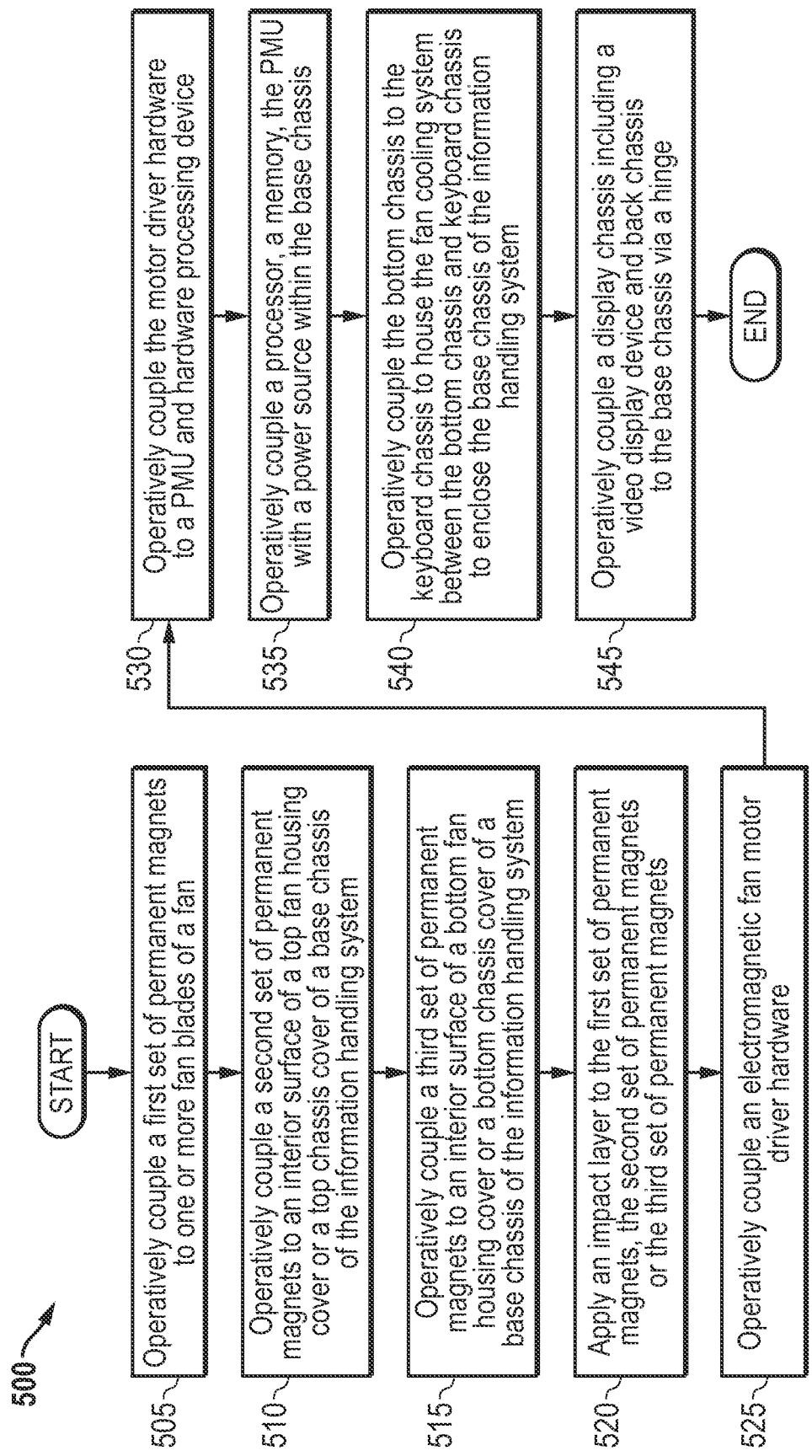
FIG. 5 is a flow diagram of a method of manufacturing a fan cooling system with a magnetically suspended fan for an information handling system according to an embodiment of the present disclosure.

FIG. 5 is a flow diagram of a method 500 of manufacturing a fan cooling system with a magnetically suspended fan for an information handling system according to an embodiment of the present disclosure. The method includes, at block 505 with operatively coupling a first set of permanent magnets to one or more fan blades of a fan. In an embodiment, the any given pair of first set of permanent magnets may be attached to oppositely oriented fan blades such that the weight of the first set of permanent magnets may be equally distributed and so that the fan is generally weighted correctly for rotation. It is appreciated that not all the fan blades, in an embodiment, may include a first set of permanent magnets coupled to their terminal ends but a sufficient number of fan blades may include a magnet in order to properly balance the fan as it rotates between the second set of permanent magnets and third set of permanent magnets.

The method 500 may include, at block 510 operatively coupling a second set of permanent magnets to an interior surface of a top fan housing cover or top chassis cover of a base chassis of the information handling system. The magnetically suspended cooling fan system of various embodiments herein, may include a top fan housing cover of a fan housing or may be attached to a top chassis cover of a based chassis for an information handling system. As described herein in an embodiment, the second set of permanent magnets may be shaped to include a trough into which the first set of permanent magnets of the fan blades may fit when the information handling system is assembled. This trough formed in the second set of permanent magnets may partially surround the first set of permanent magnets such that movement of the first set of permanent magnets is restricted to only passing through the trough. As such, movement of the first set of permanent magnets is, at least partially, restricted not only in a vertical direction but also from side to side preventing the fan from moving laterally between the second set of permanent magnets and, accordingly, between the top fan housing cover or top chassis cover and bottom fan housing cover or bottom chassis cover.

At block 515 of the method 500 a third set of permanent magnets is operatively coupled to an interior surface of a bottom fan housing cover or bottom chassis cover of a base chassis of the information handling system. The magnetically suspended cooling fan system of various embodiments herein, may include a bottom fan housing cover of a fan housing or may be attached to a bottom chassis cover of a based chassis for an information handling system. Again, the third set of permanent magnets may be shaped to include a trough into which the first set of permanent magnets of the fan blades may fit when the information handling system is assembled. This trough formed in the third set of permanent magnets may partially surround the first set of permanent magnets such that movement of the first set of permanent magnets is restricted to only passing through the trough. As such, movement of the first set of permanent magnets is, at least partially, restricted not only in a vertical direction but also from side to side preventing the fan from moving laterally between the third set of permanent magnets and, accordingly, between the top fan housing cover or top chassis cover and bottom fan housing cover or bottom chassis cover.

At block 520, an impact layer of rubber, silicone, plastic, or other flexible material that is magnetically transparent may be applied to any combination of the first set of permanent magnets, the second set of permanent magnets, or the third set of permanent magnets. In some embodiments, all three sets of permanent magnets may have an impact layer. In other embodiments, some subset of sets of permanent magnets may have an impact layer. For example, in one embodiment, only the first set of permanent magnets has an impact layer. In another embodiment, the second and third sets of permanent magnets have the impact layer. It is contemplated in various embodiments that the first, second or third sets of permanent magnets may have the impact layer applied prior to installation on the fan blades or at the fan housing covers chassis covers of a base chassis.

The method 500 further includes, at block 525, operatively coupling the electromagnetic fan motor to motor driver hardware. In an embodiment, the fan motor may include an electromagnetic motor that interfaces with one or more permanent magnets formed into the fan hub. As the electromagnetic motor is activated by the motor driver hardware, the selective repulsion or attraction by the electromagnets of the electromagnetic motor causes the fan hub and fan blades to rotate thereby creating an airflow through the housing of the information handling system.

At block 530, the method includes operatively couple the motor driver hardware to a PMU and hardware processing device. As described herein, the fan cooling system includes motor driver hardware and a fan motor used to rotate the fan. The motor driver hardware and fan motor may be operated via the hardware processor, an EC, or other hardware processing resource as a temperature of heat-generating hardware components are detected. In an embodiment, the fan motor and motor driver hardware may be activated and controlled as the temperature sensors detect changes in temperatures within the chassis of the information handling system and/or changes in temperatures of one or more hardware components within the chassis of the information handling system. In an embodiment, the motor driver hardware and fan motor may rotate the fan at different speeds with the speed of the fan being increased linearly with the detected changes in temperature. The PMU 120 may include a controller and executable code instructions to manage the power provided to the components of the information handling system 100 such as the hardware processor 102, and manage control of the fan cooling system 154 that includes the fan motor 158, motor driver hardware 160, and any electromagnets associated with the driving of the fan 156. Additionally, the PMU may control power to one or more components including the fan cooling system, one or more drive units, the hardware processor (e.g., CPU), the GPU, a video/graphic display device or other input/output devices such as the stylus, a mouse, a keyboard, and a trackpad and other components that may require power when a power button has been actuated by a user. In an embodiment, the PMU may monitor for or receive data descriptive of a temperature with the base chassis of the information handling system and cause the fan motor, via the motor driver hardware, to speed up or slow down as these temperature changes are detected.

The method 500 further includes, at block 535, operatively coupling a process, a memory, the PMU with a power source (e.g., a battery) within the base chassis. In an embodiment, these hardware devices among other hardware devices, are arranged within the base chassis so that the fan cooling system 154 described herein may effectively cool these systems via the creation of an airflow over or near these devices and other passive heat conducting devices.

The method 500 further includes operatively coupling the bottom chassis cover to the top chassis cover to house the magnetically suspended fan cooling system between the bottom fan housing cover or bottom chassis cover and top fan housing cover or top chassis cover and to enclose the base chassis of the information handling system at block 540. In an embodiment, the coupling of the bottom chassis cover to the top chassis cover includes sealing the two chassis together so that the hardware inside is not easily accessible to a user and may further include waterproofing or water resisting techniques.

The method 500 also includes, at block 545, operatively coupling a display chassis including a video display device and back chassis to the base chassis via a hinge. As described herein, the information handling system may be a 360°-type or laptop-type information handling system 100 that includes a plurality of metal chassis. The base chassis, in an embodiment, may be operatively coupled to a display chassis via a hinge. In an embodiment, this hinge may be a drop-down hinge that drops the display chassis down as the display chassis is placed in an open position as shown. Once the information handling system is assembled, the method 500 may end here.

The blocks of the flow diagrams of FIG. 5 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
 a processor;
 a memory device;
 a power management unit (PMU) to provide power to the processor and memory device;
 a magnetically suspended fan comprising:
  a fan including a plurality of fan blades rotationally turned by a fan motor;
  a first set of permanent magnets operatively coupled to the plurality of fan blades;
  a second set of permanent magnets operatively coupled to an interior side of a top chassis cover of the information handling system; and
  a third set of permanent magnets operatively coupled to an interior side of a bottom chassis cover of the information handling system, wherein the second set of permanent magnets and third set of permanent magnets repel the first set of permanent magnets to suspend the plurality of fan blades between the top chassis cover and bottom chassis cover.

2. The information handling system of claim 1 further comprising:
 an impact layer formed on an exterior surface of the first set of permanent magnets of the plurality of fan blades to prevent damage to the magnetically suspended fan during operation.

3. The information handling system of claim 1 further comprising:
 an impact layer formed on an exterior surface of the second set of permanent magnets and third set of permanent magnets to prevent damage to the magnetically suspended fan during operation.

4. The information handling system of claim 1 further comprising:

a motor driver hardware operatively coupled to the fan motor to rotate the fan.

5. The information handling system of claim 1 wherein the fan motor comprises an electromagnet driver that magnetically interfaces with central hub permanent magnets in a central hub of the fan to rotate the fan.

6. The information handling system of claim 5 further comprising:
the first set of permanent magnets comprise permanent magnets operatively coupled to terminal ends of oppositely oriented fan blades of the same polarity as the second set of magnets and the third set of magnets.

7. The information handling system of claim 1 further comprising:
an impact layer including a layer of rubber formed on an exterior surface of the first set of magnets.

8. The information handling system of claim 1 further comprising:
the second set of permanent magnets and the third set of permanent magnets forming a trough into which the first set of permanent magnets are suspended.

9. A fan cooling system of an information handling system comprising:
a magnetically suspended fan comprising:
a fan including a plurality of fan blades and a central hub rotated by a fan motor;
a first set of permanent magnets operatively coupled to the plurality of fan blades;
a second set of permanent magnets operatively coupled to an interior side of a top chassis cover of the information handling system;
a third set of permanent magnets operatively coupled to an interior side of a bottom chassis cover of the information handling system; and
a first impact layer formed on an exterior surface of the first set of permanent magnets to prevent damage to the magnetically suspended fan during operation;
wherein the second set of permanent magnets and third set of permanent magnets repel the first set of permanent magnets to suspend the plurality of fan blades between the top chassis cover and bottom chassis cover during rotation.

10. The fan cooling system of claim 9 further comprising:
a second impact layer formed on an exterior surface of the second set of permanent magnets and third set of permanent magnets to prevent damage to the magnetically suspended fan during operation.

11. The fan cooling system of claim 9 further comprising:
a motor driver hardware operatively coupled to the fan motor to rotate the fan.

12. The fan cooling system of claim 9, wherein the fan motor comprises an electromagnet driver that magnetically interfaces with central hub permanent magnets in the central hub of the fan to rotate the fan.

13. The fan cooling system of claim 9 further comprising:
the first set of permanent magnets comprise permanent magnets operatively coupled to terminal ends of oppositely oriented fan blades.

14. The fan cooling system of claim 9 further comprising:
the first impact layer including a layer of rubber.

15. The fan cooling system of claim 9 further comprising:
the second set of permanent magnets and the third set of permanent magnets forming a trough into which the first set of permanent magnets are suspended during fan rotation.

16. A fan cooling system of an information handling system comprising:
a magnetically suspended fan comprising:
a fan including a plurality of fan blades and a central hub rotated by a fan motor;
a first set of permanent magnets operatively coupled to the plurality of fan blades;
a second set of permanent magnets operatively coupled to an interior side of a top chassis cover of the information handling system;
a third set of permanent magnets operatively coupled to an interior side of a bottom chassis cover of the information handling system; and
a first impact layer formed on an exterior surface of the second set of permanent magnets and a second impact layer formed on an exterior surface of the third set of permanent magnets to prevent damage to the magnetically suspended fan during operation, wherein the second set of permanent magnets and third set of permanent magnets repel the first set of permanent magnets to suspend the plurality of fan blades between the top chassis cover and the bottom chassis cover.

17. The fan cooling system of claim 16 further comprising:
a motor driver hardware operatively coupled to the fan motor to rotate the fan wherein the fan motor comprises an electromagnet driver that magnetically interfaces with central hub permanent magnets in the central hub of the fan.

18. The fan cooling system of claim 17 further comprising:
the first set of permanent magnets comprise permanent magnets operatively coupled to terminal ends of oppositely oriented fan blades.

19. The fan cooling system of claim 16 further comprising:
the first impact layer and second impact layer including a flexible material.

20. The fan cooling system of claim 16 further comprising:
the second set of permanent magnets and the third set of permanent magnets forming a trough into which the first set of permanent magnets are suspended during rotation.

* * * * *